Dec. 6, 1960 V. F. DAHLGREN 2,963,392

METHOD OF SPLICING PRINTED CIRCUITS

Filed May 7, 1958

Victor F. Dahlgren
INVENTOR

United States Patent Office 2,963,392
Patented Dec. 6, 1960

2,963,392

METHOD OF SPLICING PRINTED CIRCUITS

Victor F. Dahlgren, West Windham, N.H., assignor to Sanders Associates, Inc., Nashua, N.H., a corporation of Delaware Filed May 7, 1958, Ser. No. 733,710

11 Claims. (Cl. 154—2.22)

The present invention relates to printed circuit articles such as flat, flexible cabling, utilizing copper conductors bonded to a wide range of plastic materials. More particularly, this invention relates to a method of splicing flat, flexible, printed circuit cables.

Typically, flexible printed circuit cables are formed from flat, relatively thin sheets of plastic material having embedded therein flat, thin conductors all in the same plane or, at most, in a few superimposed planes. In one form of such a cable, the conductors are of uniform width and are separated uniformly. The present invention is directed to an improvement in such printed circuits by providing a solution for the problems arising from the necessity for splicing the circuit conductors. In the past, flexible, printed circuit cables have been manufactured by etching out conductors on copper sheets laminated to a flexible plastic. The etched-out conductors are then cover-coated to insulate them more fully from each other and from mechanical wear and moisture. This cover coat is generally bonded to the conductors and insulating base by means of heat and pressure. To provide long lengths of the cable it is often necessary to splice or piece together shorter cable segments. The fact that the cable conductors are generally very thin, of the order of one to four mils in thickness, coupled with the fact that the cable insulation is very thin and extremely rugged, presents obstacles to achieving a good splice which are certainly not common to the splicing of conventional wires. If one attempts to remove the printed circuit cable insulation in the conventional manner, great care must be taken to avoid cutting the foil-like conductors. Then too, a stripping means must be devised which will remove the oxide coating on the cable conductors that is often used to improve the bond strength of the conductors to the insulation. A further obstacle to achieving a good splice lies in the fact that the foil-like cable conductors cannot be twisted to provide a junction of good mechanical strength because they will either tear or provide a lumpy splice that will seriously impair flexibility after the splice is insulated.

It is, therefore, an object of the present invention to provide an improved method of extending the dimensions of a printed circuit cable.

It is a further object of this invention to provide an improved method of splicing printed circuit cable conductors.

Yet another object of this invention is to provide an improved flexible printed circuit cable.

In accordance with the present invention, there is provided a method of simultaneously baring a plurality of elongated, flat, coplanar, copper conductors embedded in a single insulated plastic body. The copper conductors have adjacent, thin, long edges in substantially juxtaposed relationship, and have a thickness of substantially .001 to .004 inch. The method includes applying an abrasive instrumentality to one side and above the flat faces of the insulating conductors and transverse to the length thereof. Therefore, the insulating material is removed, and the copper conductors are simultaneously bared on that side. In addition, an abrasive instrumentality is applied to the opposite side of the insulated conductors and transverse to the length thereof whereby the insulating material is removed and the copper conductors are simultaneously bared on the opposite side.

As used herein, the term "plastic" includes a synthetic organic material of high molecular weight and which, while solid in the finished state, at some stage in its manufacture is soft enough to be formed into shape by some degree of flow.

The well-known term "Kel-F" as used herein is the trademark of the M. W. Kellogg Company and refers to the plastic polymonochlorotrifluoroethylene as manufactured by them.

The well-known term "Teflon" as used herein is the trademark of the E. I. du Pont de Nemours & Company, Inc. and refers to the plastic polytetrafluoroethylene as manufactured by them.

The term "ethylene" includes all those plastic materials containing an ethylene radical and the term "vinyl" includes all those plastic materials containing a vinyl radical.

The term "Saran," trademark of the Dow Chemical Company, is used herein to denote those plastic materials containing a vinylidine radical.

The term "nylon" as used herein refers generically to the group of plastic materials known as polyamides.

For a better understanding of the present invention, together with other and further objects thereof, reference is made to the following description taken in connection with the accompanying drawings and its scope will be pointed out in the appended claims.

Figure 1:
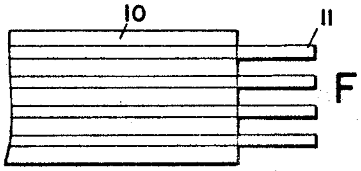
Fig. 1 is a plan view of a printed circuit cable with the insulation stripped from the conductor ends.

Referring now to the drawings and with particular reference to Fig. 1, there is here illustrated a flat, flexible printed circuit cable having planar conductors embedded therein. In order to form continuous lengths of the cable 10, the ends of conductors 11 are stripped of insulation so that segments of the cable 10 may be spliced.

Figure 2:
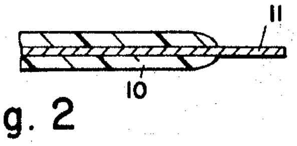
Fig. 2 is an elevational view in section of the printed circuit cable of Fig. 1.
Figure 3:
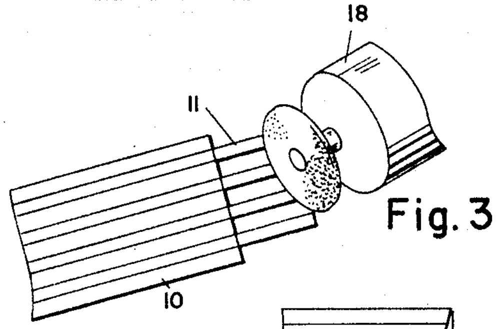
Fig. 3 is a perspective view of a printed circuit cable illustrating removal of the insulation from the conductor ends by means of a rotary abrasive tool.

Fig. 2 is an elevational view of the cable 10, showing the stripped end of conductor 11. This stripping operation may be best accomplished by means of a cable stripper (not shown) or by the use of a rotary abrasive tool 18, as more particularly illustrated in Fig. 3.

In order to join the cable conductors 11 of various cable segments 10, the conductor surfaces must be cleaned of any foreign material. Where this is not adequately done by the stripping or abrading operation, it may be accomplished by chemically cleaning the conductor surfaces.

Figure 4:
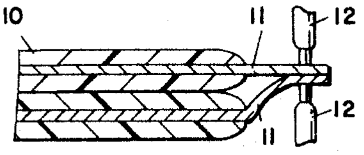
Fig. 4 is an elevational view, in section, of two printed circuit cables illustrating splicing of the cable conductors by means of resistance welding.

After the conductor areas are exposed and cleaned, the cable segments are superimposed on one another so that the exposed conductor areas of the respective conductors of each cable segment are in register as illustrated in Fig. 4. The exposed conductor areas are then clamped between welding electrodes 12 and resistance welded permanently to join the conductors and form an area of electrical contact.

Figure 5:
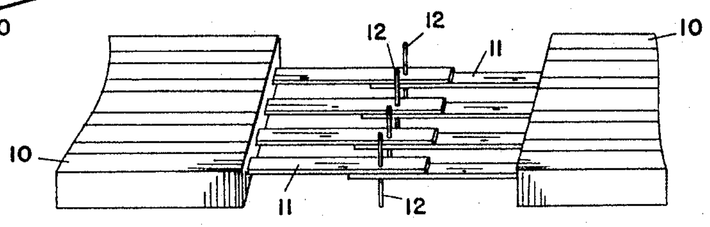
Fig. 5 is a perspective view of two printed circuit cables illustrating splicing of the cable conductors by simultaneously resistance welding all conductors.

Fig. 5 is a perspective view, illustrating a simple lap joint of the exposed conductor areas wherein a multiple electrode welding unit simultaneously resistance welds all the conductors. The welding electrodes 12 are carried on bars, not shown, which can be controlled simultaneously to close and open all electrode pairs. The positioning of each electrode pair can be varied to conform with any conductor spacing or configuration, thus providing a splicing setup for use in mass producing any given conductor arrangement. A good welding electrode for this usage is Duo-weld Model UT–857 with size 2 tips which may be used in the Weldmatic Model 1015 welder as manufactured by the Weldmatic Division of Unitek Corporation, Pasadena, California. For 1, 2, and 3 oz., 0.00137, 0.0027, and 0.0041 inch, respectively, copper conductors, e.g., a 2 watt-seconds pulse time has been found to effect a good bond at the conductor junction. Anything in the range of 0.5 watt-second to 5.0 watt-seconds, however, will most likely produce a satisfactory union. The time and power requirements are, of course, a function of the type of metal used and the width and thickness of the conductors. By modifying the pulse times, other type conductors that can be joined by this process include ferrous, aluminum, and copper alloys.

Figure 6:
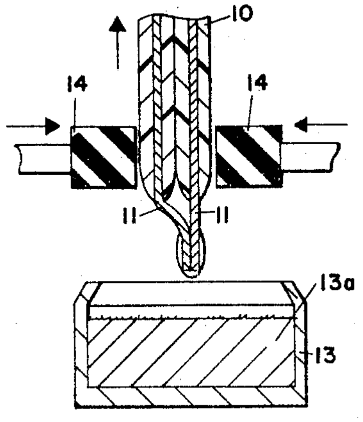
Fig. 6 is an elevational view in section of two printed circuit cables illustrating splicing of the cable conductors by means of dip soldering.

An alternative method of insuring a good electrical union of the conductors 11 at the junction area involves the utilization of dip soldering techniques as more especially illustrated in Fig. 6. Here the cable segments 10 are superimposed upon each other as described with reference to Fig. 4; however, the exposed conductor areas are pinched together, treated with flux, and dipped into a vessel 13 containing molten solder 13*a*. Upon withdrawal of the cable conductors 11 from the solder 13*a*, the excess solder is removed as, for example, by the two rubber blocks 14 which gently squeeze the conductors together during the withdrawing operation.

After the conductors 11 are joined, the cable segments 10 are separated and stretched out into coplanar relationship. The conductor junctions 11*a* may then be protected by plating with an inert metal, by the application of pressure-sensitive tape, or by encapsulation in a plastic insulating material under heat and pressure. For greatest flexibility, durability, and protection, the latter is preferred.

Figure 7:
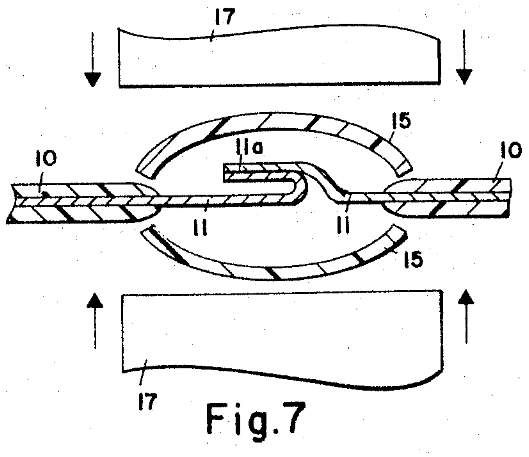
Fig. 7 is an elevational view in section of two printed circuit cables having spliced conductors, illustrating encapsulation of the splice by lamination between layers of plastic insulating material.

Referring now to Fig. 7, there is here schematically illustrated the operation of encapsulating the conductor junction 11*a* by lamination of the junction 11*a* between layers of a plastic insulating material 15 under heat and pressure. To effect this sealing step, the two cable segments are stretched out into coplanar relationship, as heretofore described, and the conductor junction 11*a* is folded down parallel to the conductor 11. The plastic insulating material 15 is then placed above and below conductor 11 and conductor junction 11*a*. Finally, heat and pressure are applied by means of a sealer as, for example, a D.S.–150–W sealer, as manufactured by Dobeckmun Company of Cleveland, Ohio, permanently to encapsulate the splice. The jaws of the sealer are represented by the fragmented elements 17.

Figure 8:
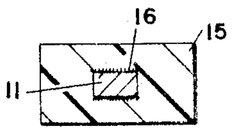
Fig. 8 is an elevational view in cross-section of a cupric oxide coated cable conductor.

The parameters involved in this sealing operation are time-temperature, primarily; and, to some degree, time and temperature in terms of the pressure applied may be interchanged. If copper conductors are used adherence to a thermoplastic cover coat can be enhanced by producing a cupric oxide coating on the surface of the copper. A cross-sectional view of such a conductor is illustrated in Fig. 8 which more especially shows the copper conductor 11, the cupric oxide coating 16, and the thermoplastic insulation 15. The thermoplastic-copper bonding mechanism is not thoroughly understood; however, as a result of much experimentation and analysis, it is believed that the bonding mechanism is essentially mechanical. One basic requirement seems to be that the thermoplastic material must flow fairly readily without decomposing. As indicated in the following table, some of the materials tend to decompose before the desired melt-viscosity is reached even though a satisfactory bond may be obtained. In the case of some forms of Teflon, the degree of plasticity increases with temperature, but the material tends to decompose before it reaches a suitable flow point. It will be apparent, however, that while a degree of flow is necessary to cause the plastic material to fill the interstices formed by the cupric oxide needles, more or less randomly oriented, a good bond is obtainable even though ideal flow conditions are not realized. In the case of the polyvinyl material it has been frequently observed that the bond is stronger than the plastic material itself. Thus, for polyvinyl chloride and polyvinyl acetate the peel strength is indicated in the order of 3000 grams. This is the pulling force at which the plastic material broke.

*Parameters for bonding copper to plastic*

| | Temp. of Materials (° C.) | Pressure (Lbs./In.²) | Time of Preheat (Min.) | Min. Time in Press. (Min.) | Thickness of Copper ($10^{-3}$ In.) | Thickness of Plastic ($10^{-3}$ In.) | Peel Strength (Grs./In.) |
|---|---|---|---|---|---|---|---|
| Ethylenes: | | | | | | | |
| Polyethylene | 127 | 70–80 | 1 | 4 | 1.35 | ------------ | [2] >3,000 |
| Kel–F | 234 | 120–150 | 5 | 6 | 1.35 | 10 | 4,200 |
| Teflon [1] | 380 | 120–150 | 5 | 6 | 2.70 | 10 | 1,650 |
| Vinyls: | | | | | | | |
| Polyvinyl Chloride | 220 | 120–150 | 1 | 4 | 1.35 | 10 | 3,100 |
| Polyvinyl Butyral | 193 | 120–150 | 1 | 4 | 2.70 | 8.5 | 3,300 |
| Polyvinyl Acetate | 200 | 120–150 | 1 | 4 | 2.70 | 10 | 3,100 |
| Polyvinyl Alcohol [1] | 205 | 325–350 | 1 | 4 | 2.70 | 11 | 5,500 |
| Saran: | | | | | | | |
| Polyvinylidene Chloride | 180 | 120–150 | 1 | 4 | 2.70 | 12 | (3) |
| Polyvinylidene Styrene | 205 | 120–150 | 5 | 6 | 2.70 | 31 | 2,500 |
| Polyamides: | | | | | | | |
| Nylon NC–10 [1] | 250 | 325–350 | 5 | 6 | 1.35 | Crystals | 4,000 |
| Cellulosics: | | | | | | | |
| Cellulose Acetate [1] | 193 | 120–150 | 1 | 4 | 2.70 | 30 | 7,260 |
| Acrylics: | | | | | | | |
| Methyl Methacrylate [1] (Plexiglas) | 250 | 325–350 | 5 | 6 | 2.70 | 66 | 2,000 |
| Rubber Hydroxide [1] | 122 | 120–150 | 1 | 4 | 1.35 | 9 | Decomposes |

[1] Press—water cooled.
[2] Tearing of polyethylene.
[3] Turned brown—tearing of material at 1500 grams.

The present invention represents an important step forward in the art of printed circuitry, in that it facilitates the manfuacturing of flexible printed circuits of larger dimensions than has heretofore been considered possible.

While there have been described what are at present considered to be the preferred embodiments of this invention, it will be obvious to those skilled in the art that various changes and modifications may be made therein without departing from the invention, and it is, therefore, aimed in the appended claims to cover all such changes and modifications as fall fairly within the true spirit and scope of the invention.

What is claimed is:

1. A method of simultaneously baring a plurality of elongated, flat, coplanar, copper conductors embedded in a single insulating plastic body with the adjacent thin, long edges of said conductors in substantially juxtaposed relationship and said conductor having a thickness of substantially .001 inch to .004 inch, comprising: applying an abrasive instrumentality to one side and above the flat faces of said insulated conductors and transverse to the length thereof, whereby said insulating material is removed and said copper conductors are simultaneously bared on said side; and applying an abrasive instrumentality to the opposite side of said insulated conductors and transverse to the length thereof, whereby said insulating material is removed and said copper conductors are simultaneously bared on said opposite side.

2. A method of splicing a printed circuit cable having a plurality of elongated, flat, coplanar, copper conductors embedded in a single insulated plastic body with the adjacent thin, long edges of said conductors in substantially juxtaposed relationship, and said conductors having a thickness of substantially .001 inch to .004 inch, comprising: applying an abrasive instrumentality to one side and above the flat faces of said insulated conductors and transverse to the length thereof, whereby said insulating material is removed and said copper conductors are simultaneously bared on said side; applying an abrasive instrumentality to the opposite side of said insulated conductors and transverse to the length thereof, whereby said insulating material is removed and said copper conductors are simultaneously bared on said opposite side; simultaneously joining said conductors to a plurality of conductors to form an electrical contact; and encapsulating the conductor junctions with a plastic insulating material.

3. A method of simultaneously baring a plurality of elongated, flat, coplanar, copper conductors embedded in a single insulated plastic body with the adjacent thin, long edges of the conductors in substantially juxtaposed relationship, said conductors having a thickness of substantially .001 inch to .004 inch, comprising: applying a rotary abrasive tool to one side and above the flat faces of said insulated conductors and transverse to the length thereof, whereby said insulating material is removed and said copper conductors are simultaneously bared on said side; and applying a rotary abrasive tool to the opposite side of said insulated conductors and transverse to the length thereof, whereby said insulating material is removed and said copper conductors are simultaneously bared on said opposite side.

4. A method of splicing a printed circuit cable having a plurality of elongated, flat, coplanar, copper conductors embedded in a single insulated plastic body with the adjacent thin, long edges of said conductors in substantially juxtaposed relationship, and said conductors having a thickness of substantially .001 inch to .004 inch, comprising: applying an abrasive instrumentality to one side and above the flat faces of said insulated conductors and transverse to the length thereof, whereby said insulating material is removed and said copper conductors are simultaneously bared on said side; applying an abrasive instrumentality to the opposite side of said insulated conductors and transverse to the length thereof, whereby said insulating material is removed and said copper conductors are simultaneously bared on said opposite side; simultaneously joining said conductors to a plurality of conductors to form an electrical contact by resistance welding with prepositioned welding electrodes simultaneously controlled; and encapsulating the conductor junctions with a plastic insulating material.

5. A method of splicing a printed circuit cable having a plurality of elongated, flat, coplanar, copper conductors embedded in a single insulated plastic body with the adjacent thin, long edges of said conductors in substantially juxtaposed relationship, and said conductors having a thickness of substantially .001 inch to .004 inch, comprising: applying an abrasive instrumentality to one side and above the flat faces of said insulated conductors and transverse to the length thereof, whereby said insulating material is removed and said copped conductors are simultaneously bared on said side; applying an abrasive instrumentality to the opposite side of said insulated conductors and transverse to the length thereof, whereby said insulating material is removed and said copper conductors are simultaneously bared on said opposite side; simultaneously joining said conductors to a plurality of conductors to form an electrical contact by simultaneously dip soldering all junctions; and encapsulating the conductor junctions with a plastic insulating material.

6. A method of splicing a printed circuit cable having a plurality of elongated, flat, coplanar, copper conductors embedded in a single insulated plastic body with the adjacent thin, long edges of said conductors in substantially juxtaposed relationship and said conductors having a thickness of substantially .001 inch to .004 inch, comprising: applying an abrasive instrumentality to one side and above the flat faces of said insulated conductors and transverse to the length thereof, whereby said insulating material is removed and said copper conductors are simultaneously bared on said side; applying an abrasive instrumentality to the opposite side of said insulated conductors and transverse to the length thereof, whereby said insulating material is removed and said copper conductors are simultaneously bared on said opposite side; simultaneously joining said conductors to a plurality of conductors to form an electrical contact; and laminating the conductor junctions between layers of plastic sheets by means of a hand press.

7. A method of splicing a printed circuit cable having a plurality of elongated, flat, coplanar, copper conductors embedded in a single insulated plastic body with the adjacent thin, long edges of said conductors in substantially juxtaposed relationship and said conductors having a thickness of substantially .001 inch to .004 inch, comprising: applying an abrasive instrumentality to one side and above the flat faces of said insulated conductors and transverse to the length thereof, whereby said insulating material is removed and said copper conductors are simultaneously bared on said side; applying an abrasive instrumentality to the opposite side of said insulated conductors and transverse to the length thereof, whereby said insulating material is removed and said copper conductors are simultaneously bared on said opposite side; simultaneously mechanically and electrically joining all of said conductors by resistance welding all of said conductors with pre-positioned welding electrodes simultaneously controlled; and encapsulating the conductor junction by laminating said junctions between layers of plastic insulating material under heat and pressure.

8. A method of splicing a printed circuit cable having a plurality of elongated, flat, coplanar, cupric oxide coated copper conductors encapsulated in a single insulated plastic body with the adjacent thin, long edges of said conductors in substantially juxtaposed relationship, and said conductors having a thickness of substantially .001 inch to .004 inch comprising: applying an abrasive instrumentality to one side and above the flat faces of said insulated conductors and transverse to the length thereof, whereby said insulating material and oxide coating is removed and said copper conductors are simultaneously bared on said side; applying an abrasive instrumentality to the opposite side of said insulated conductors and transverse to the length thereof, whereby said insulating material and oxide coating is removed and said copper conductors are simultaneously bared on said opposite side; simultaneously mechanically and electrically joining all of said conductors by means of lapping said conductor ends and resistance welding all of said lapped joints with pre-positioned welding electrodes simultaneously controlled; and encapsulating said conductor junctions by laminating said junctions between layers of plastic insulating material under heat and pressure.

9. A method of splicing a printed circuit cable having a plurality of elongated, flat, coplanar, cupric oxide coated copper conductors embedded in a single insulated plastic body with the adjacent thin, long edges of said conductors in substantially juxtaposed relationship and said conductors having a thickness of substantially .001 inch to .004 inch, comprising: applying an abrasive instrumentality to one side and above the flat faces of said insulated conductors and transverse to the length thereof, whereby said insulating material and oxide coating is removed and said copper conductors are simultaneously bared on said side; applying an abrasive instrumentality to the opposite side of said insulated conductors and transverse to the length thereof, whereby said insulating material and oxide coating is removed and said copper conductors are simultaneously bared on said opposite sides; simultaneously mechanically and electrically joining all of said conductors by means of superimposing upon each other the cable segments to be spliced so that the exposed conductor ends of the respective conductors of each segment are in register and resistance welding all of said exposed conductor ends with pre-positioned welding electrodes simultaneously controlled; and encapsulating the conductor junctions by stretching out said cable segments into coplanar relationship, folding down said conductor junctions parallel to the conductive path and laminating said conductor junctions between layers of plastic insulating material under heat and pressure.

10. A method of splicing a printed circuit cable having a plurality of elongated, flat, coplanar, copper conductors embedded in a single insulated plastic body with the adjacent thin, long edges of said conductors in substantially juxtaposed relationship and said conductors having a thickness of substantially .001 inch to .004 inch, comprising: applying an abrasive instrumentality to one side and above the flat faces of said insulated conductors and transverse to the length thereof, whereby said insulating material is removed and said copper conductors are simultaneously bared on said side; applying an abrasive instrumentality to the opposite side of said insulated conductors and transverse to the length thereof, whereby said insulating material is removed and said copper conductors are simultaneously bared on said opposite side; lapping said exposed conductor ends to be spliced to provide an area of contact; providing a plurality of pairs of simultaneously controllable prepositioned welding electrodes in register with each of the overlapped exposed conductor ends to be spliced; welding said overlapped conductor ends simultaneously mechanically and electrically to join said conductor ends; and encapsulating the conductor junctions with a plastic insulating material.

11. A method of splicing a printed circuit cable having a plurality of elongated, flat, coplanar, copper conductors embedded in a single insulated plastic body with the adjacent thin, long edges of said conductors disposed in substantially closely spaced relationship and said conductor having a thickness of substantially .001 inch to .004 inch, comprising: applying an abrasive instrumentality to one side and above the flat faces of said insulated conductors and transverse to the length thereof, whereby said insulating material is removed and said copper conductors are simultaneously bared on said side; applying an abrasive instrumentality to the opposite side of said insulated conductors and transverse to the length thereof, whereby said insulating material is removed and said copper conductors are simultaneously bared on said side; applying an abrasive instrumentality to the opposite side of said insulated conductors and transverse to the length thereof, whereby said insulating material is removed and said copper conductors are simultaneously bared on said opposite side; superimposing on each other the cable segments to be spliced so that said exposed conductor ends of the respective conductors of each cable segment are in register; simultaneously mechanically and electrically joining all of said conductors by dipping said exposed conductor ends in register into molten solder; withdrawing said cable and exposed conductor ends from said solder through a pair of blocks to squeeze gently the soldered conductors together and remove any excess solder; stretching out said cable segments into coplanar relationship and folding down said conductor junctions parallel to the conductive paths; and encapsulating the conductor junctions with a plastic insulating material.

References Cited in the file of this patent

UNITED STATES PATENTS

| | | |
|---|---|---|
| 2,669,768 | Goldsmith | Feb. 23, 1954 |
| 2,695,853 | Foreit | Nov. 30, 1954 |
| 2,723,706 | Carter | Nov. 15, 1955 |
| 2,730,473 | Batezell | Jan. 10, 1956 |
| 2,745,898 | Hurd | May 15, 1956 |
| 2,770,875 | Zimmerman | Nov. 20, 1956 |